(12) United States Patent
Shekar et al.

(10) Patent No.: US 6,184,047 B1
(45) Date of Patent: Feb. 6, 2001

(54) CONTACTOR SLEEVE ASSEMBLY FOR A PICK AND PLACE SEMICONDUCTOR DEVICE HANDLER

(75) Inventors: B. S. Chandra Shekar; Chee-Keong Tan, both of Singapore (SG)

(73) Assignee: ST Assembly Test Services Pte Ltd, Singapore (SG)

(*) Notice: Under 35 U.S.C. 154(b), the term of this patent shall be extended for 0 days.

(21) Appl. No.: 09/320,752

(22) Filed: May 27, 1999

(51) Int. Cl.[7] .................................................. G01R 31/26
(52) U.S. Cl. ............................ 438/14; 294/64.1; 29/743; 414/737
(58) Field of Search .................................. 438/14; 29/743, 29/740, 834; 294/64.1, 64.2, 64.3, 65; 414/737

(56) References Cited

U.S. PATENT DOCUMENTS

| | | | |
|---|---|---|---|
| D. 377,783 | 2/1997 | Itoh | D13/182 |
| D. 380,220 | 6/1997 | Itoh | D15/144.1 |
| 5,290,134 | 3/1994 | Baba | 414/404 |
| 5,700,045 | 12/1997 | Ganapol et al. | 294/64.1 |
| 5,707,093 | * 1/1998 | Nagai et al. | 294/64.1 |
| 5,918,911 | * 7/1999 | Sims | 285/13 |

* cited by examiner

Primary Examiner—John F. Niebling
Assistant Examiner—Viktor Simkovic
(74) Attorney, Agent, or Firm—George O. Saile; Rosemary L. S. Pike (57) ABSTRACT

An apparatus for effecting a semiconductor device handling method which includes picking up a semiconductor device by vacuum at the tip of a sleeve assembly nozzle having a longitudinal axis situated parallel to a Z axis of an orthogonal XYZ coordinate system and being movable in X and Y directions laterally of the Z axis in order to translate the sleeve assembly nozzle between different pick-up sites and a test site, and placing the semiconductor device onto a test contactor for testing, the improvements include means, operatively associated with the sleeve assembly nozzle, for adjusting the tip relative to a top surface of the semiconductor device and means, operatively associated with the sleeve assembly nozzle, for controlling the semiconductor device contact pressure by the mechanical arrangement of device members of the sleeve assembly nozzle.

6 Claims, 6 Drawing Sheets

CONTACTOR SLEEVE ASSEMBLY FOR A PICK AND PLACE SEMICONDUCTOR DEVICE HANDLER

BACKGROUND OF THE INVENTION (1) Technical Field

This invention relates to a pick and place apparatus for small articles, and more particularly, is concerned with improvements for the adjustment of a pick and place vacuum probe apparatus for high speed handling of semiconductor devices.

(2) Description of the Prior Art

Today's semiconductor devices, such as integrated circuit dice are increasing in production numbers and functionality, while decreasing in size and unit cost. For handling, as example, during test, surface mount, and other operations requiring individual processing. This is done by fully automating the handling of these small devices during the individual process operations while reducing handling downtime.

Generally, testing operations take place upon individual semiconductor chips in a high speed manner. Chips must be contained and presented to the handler in a convenient manner. Therefore, chip containers which carry a multiplicity of chips are queued at the chip handler and readied for high speed, yet, discreet handling in a first in, first out manner.

Chip handlers which are an integral part of most testing apparatus operate in a high speed pick and place manner. Conventionally, a pick and place probe translates to a chip pick-up position, lowers to take hold of the chip, raises the chip from its container, translates to a test socket, as an example, then lowers the chip for test, after test, translates back to the container and places the chip back in its container position. The description given for pick and place is a simplified translation, it may entail additional place positions, as example, placing the good chips back into their original container position, and sorting the defective chips into several defect categorized containers.

The focus of this invention is directed to a high speed SMD pick and place handler, and more particularly, to a modification of a contactor sleeve assembly such as that used on models Synax, SX141 H, and SX141C, IC test handlers, manufactured by Shinano Electronics Company Ltd., Japan.

Figure 1:
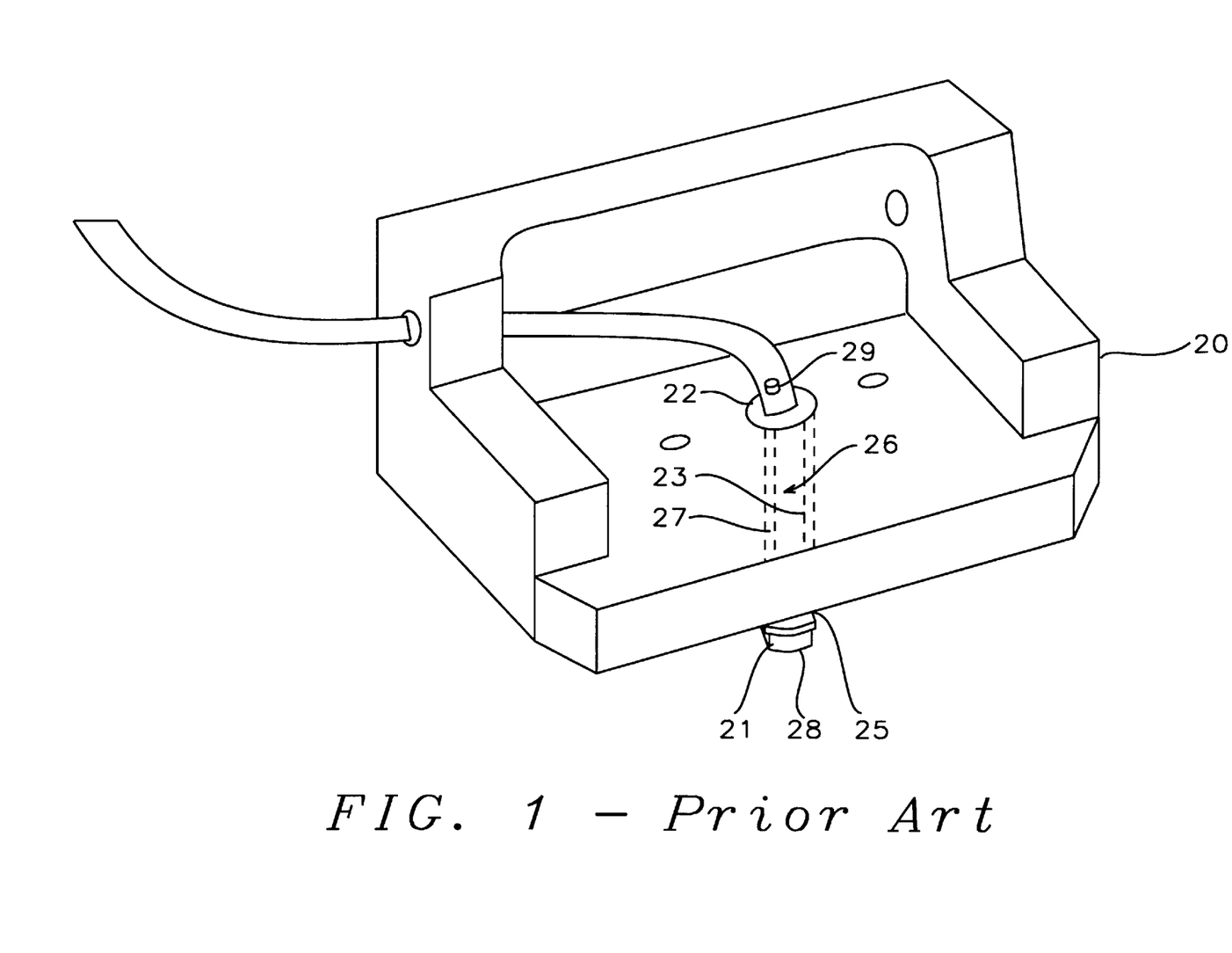
FIG. 1 is a front isometric view of the body contactor assembly of the prior art.

Each of the aforementioned handlers uses similar contactor sleeve assemblies. Referring now to FIG. 1, the contactor sleeve assembly 21 is mounted and carried by an aluminum body contactor housing 22. The contactor sleeve assembly consists of an outer hollow tube 25 having a device suction cup 28 at its distal end and a threaded hole along its longitudinal axis for engagement of a locking set screw 26. The outer hollow tube is guided by an inner hollow post 27 and is adjustable by manually loosening the locking set screw 26 permitting movement of the outer hollow tube 25 for vertical adjustment of the device suction cup 28 relative to a horizontal reference plane 10. The inner hollow post 27 has a flat area on one side of its circular shape for the tightening of the set screw 26 which applies a force normal to the vertical axis which drives the opposite side of the outer tube in a higher frictional contact with the inner post surface thus holding the outer hollow tube 25 in its vertically adjusted position. A barbed fitting 29 at the proximal end of the hollow inner post 27 communicates a vacuum pressure to the suction cup 28.

The high acceleration speeds of the pick and place handler causes loosening of mechanical settings, particularly, the vertical setting associated with the vacuum suction cup 28 on the contactor sleeve assembly 21 in relation to a chip surface. Although some vertical compliance exists between the vacuum suction cup and device, it can be transitory, therefore, a maintenance schedule is put into place for resetting the contactor sleeve assembly.

Because of the physical arrangement of the contactor head assembly 21 and the present method for locking the sleeve assembly using a set screw 26, adjustment is extremely difficult to accomplish. Both hands are required to do the adjustment. Location of the set screw is not visible from a frontal access, therefore a maintenance person must feel for the set screw position, fit a tool into a keyed recess of the set screw, loosen the set screw while holding and adjusting the body of the sleeve assembly to a fixed reference, then tightening the set screw. Since the stainless steel body of the sleeve assembly is mounted on an aluminum contactor housing 22, a differential in the coefficient of thermal expansion between the two materials causes problems during high/low temperature testing and at times necessitates forcing the adjustment of the sleeve assembly which results in damage to the sleeve assembly.

SUMMARY OF THE INVENTION

It has been an object of the present invention to provide an improved method for holding the adjusted position of the sleeve assembly during the acceleration motions of the pick and place handler.

Another object of the present invention has been to provide a method to make the sleeve assembly adjustment free of any assisted tools.

Still another object of the present invention has been to provide a method to make the sleeve assembly adjustment a single handed operation A further object of the invention has been to provide a method for achieving all height positions accurately.

Still another object of the present invention is to increase handler utilization by substantially reducing down time needed for adjustment.

Yet another object of the present invention is to reduce damage to the chips, sleeve assembly and contactor brought about by mechanical interference between the sleeve assembly and contactor.

These objects have been achieved by a design modification to the contactor sleeve assembly for the Synax 141 series handlers. The modified sleeve assembly includes a

DETAILED DESCRIPTION OF THE PREFERRED EMBODIMENT

Referring now to FIG. 1 showing an aluminum body contactor housing 20 of the prior art. The contactor sleeve assembly 21 is mounted to and moved at high speeds by the aluminum body contactor housing 20. The sleeve assembly body consists of an outer hollow tube 25 having a device suction cup 28 at its distal end and a threaded hole along its longitudinal axis for engagement of a locking set screw 26. The outer hollow tube is guided by an inner hollow post 27 and is adjustable by manually loosening the locking set screw 26 permitting movement of the outer hollow tube 25 for vertical adjustment of the device suction cup 28 relative to a horizontal reference plane 10. The inner hollow post 27 has a flat area on one side of its circular shape for the tightening of the set screw 26 which applies a force normal to the vertical axis which drives the opposite side of the outer tube in a higher frictional contact with the inner post surface thus holding the outer hollow tube 25 in its vertically adjusted position. A barbed fitting 29 at the proximal end of the hollow inner post 27 communicates a vacuum pressure to the suction cup 28.

The high acceleration speeds of the pick and place handler causes loosening of mechanical settings, particularly, the vertical setting associated with the vacuum suction cup 28 on the contactor sleeve assembly 21 in relation to a chip surface. Although some vertical compliance exists between the vacuum suction cup and device, it can be transitory, therefore, a maintenance schedule is put into place for resetting the relationship between the device suction cup 28 and the top surface of the device. See FIG. 2.

Because of the physical arrangement of the contactor head assembly 21 and the present method for locking the sleeve assembly using a set screw 26, adjustment is extremely difficult to accomplish. Both hands are required to do the adjustment. Location of the set screw is not visible from a frontal access, therefore a maintenance person must feel for the set screw position, fit a tool into a keyed recess of the set screw, loosen the set screw while holding and adjusting the body of the sleeve assembly to a fixed reference, then tightening the set screw. Since the stainless steel body of the sleeve assembly is mounted to an aluminum contactor housing 22, a differential in the coefficient of thermal expansion between the two materials causes problems during high/low temperature testing and at times necessitates forcing the adjustment of the sleeve assembly which results in damage to the sleeve assembly.

Figure 2:
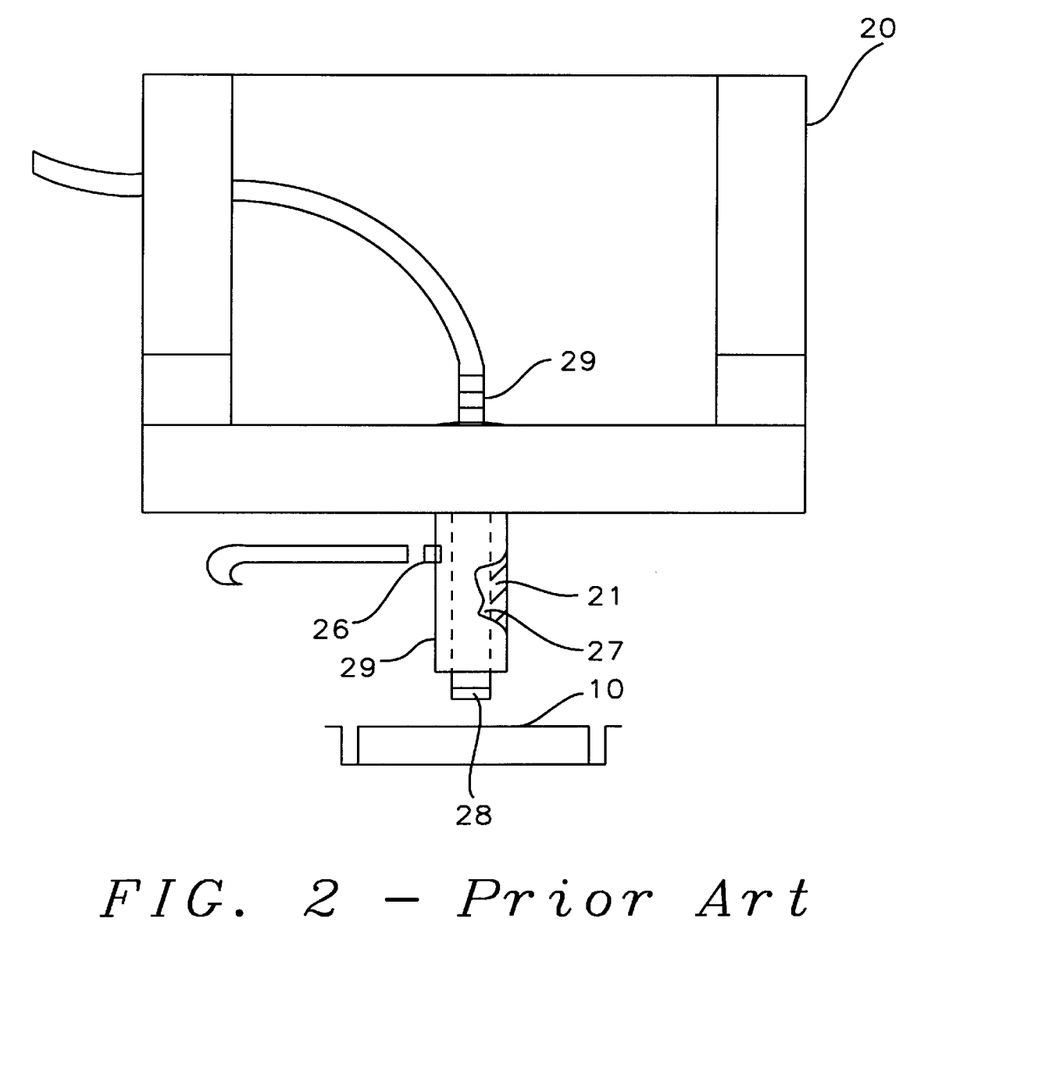
FIG. 2 is an enlarged schematic view showing the adjustment of the sleeve assembly body relative to the chip surface of the prior art.

FIG. 2 illustrates the adjustment setting between the sleeve assembly and the top surface of a chip 10 showing the raised position of the vacuum suction cup 28 and its adjusted and compliant position when in contact with the surface of the chip 10.

Figure 3:
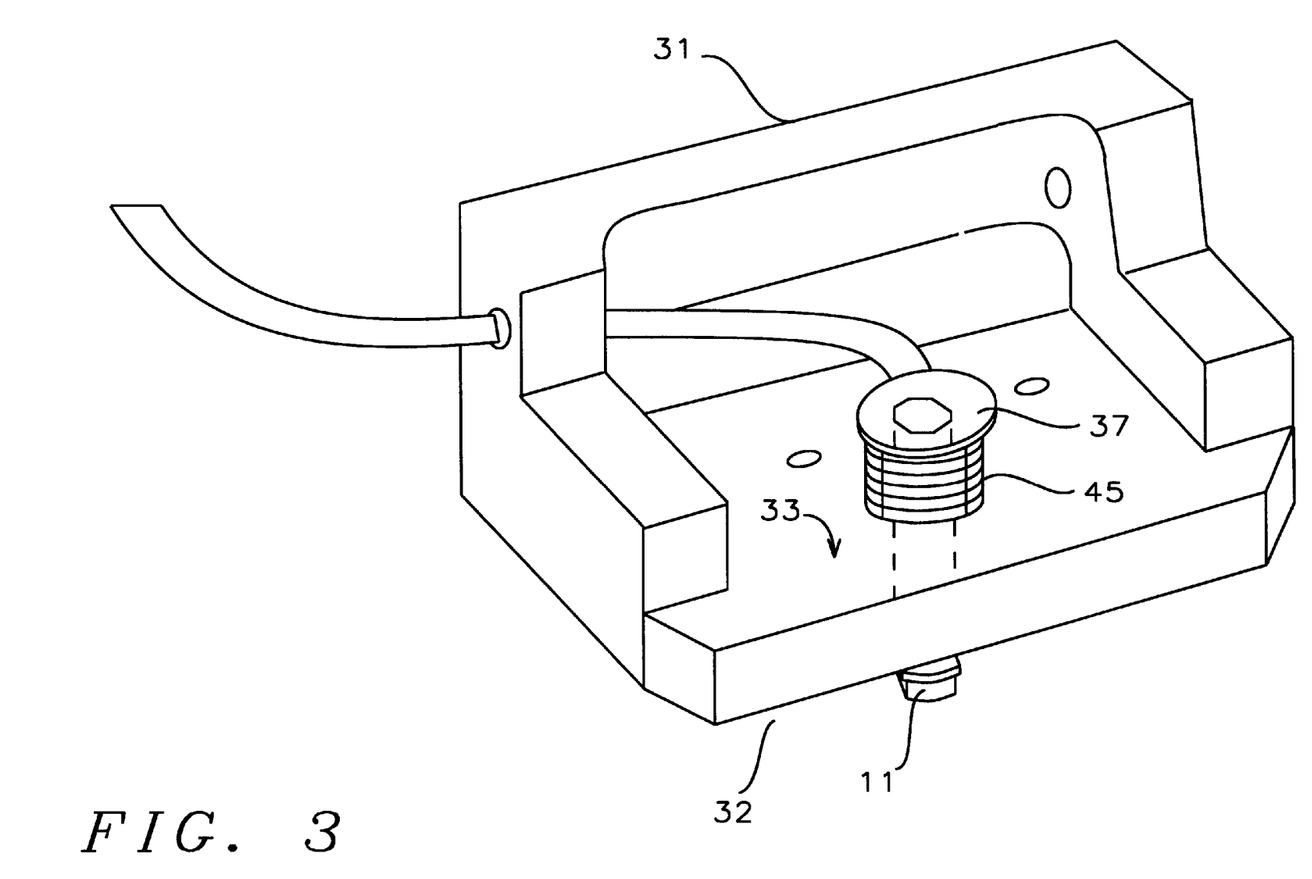
FIG. 3 is a front isometric view of the modified design for the body contactor assembly of the invention.
Figure 4:
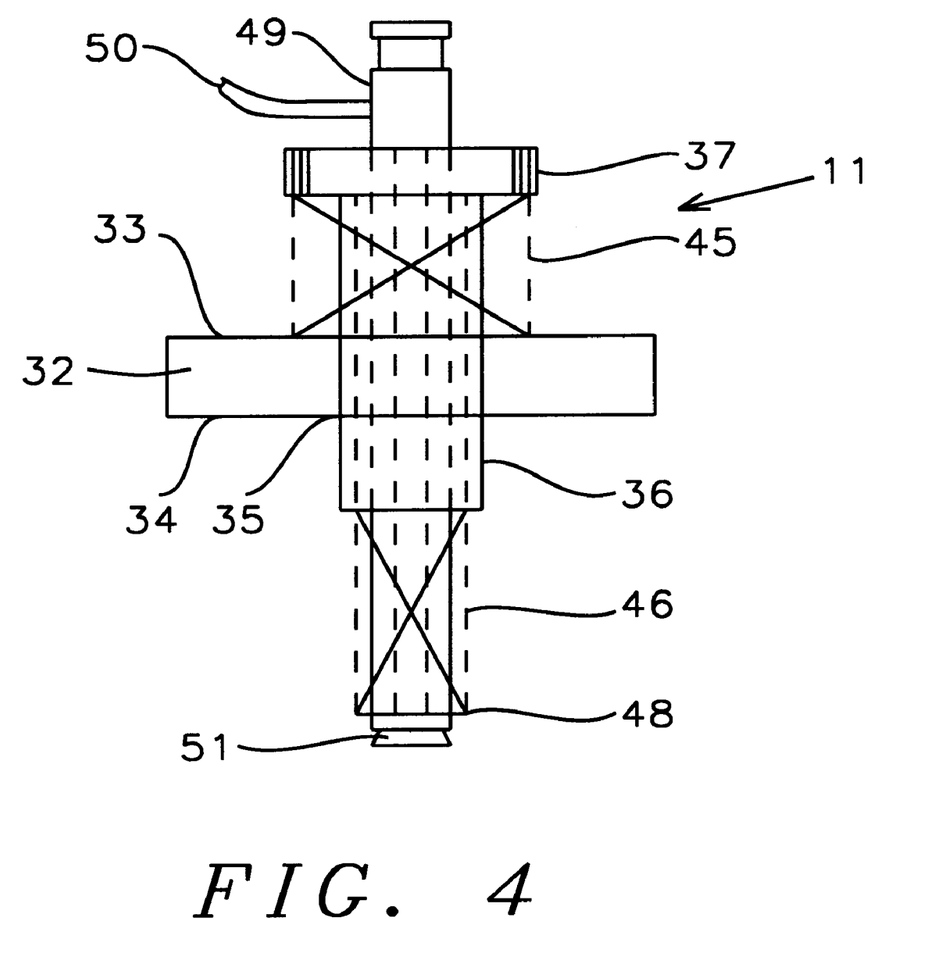
FIG. 4 is an enlarged schematic view of the modified design for the body contactor of the invention.
Figure 5:
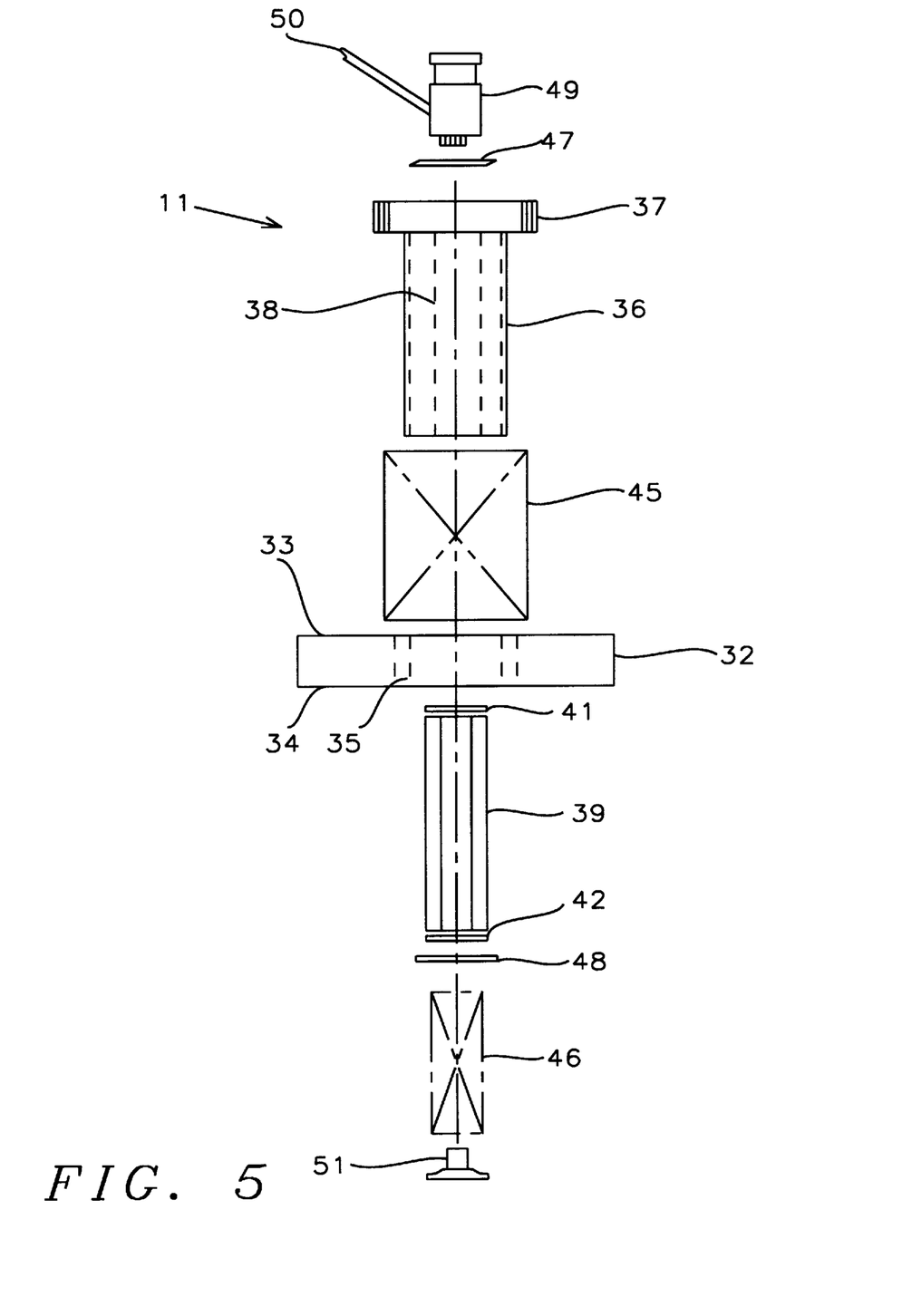
FIG. 5 is an schematic exploded view of the modified design for the body contactor of the invention.

Referring now to FIGS. 3, 4, and 5 showing various perspectives of the modified contactor sleeve assembly nozzle 11, of the invention. An aluminum body contactor housing 31 having a base member 32 with a top and bottom surface 33 and 34 respectively. A threaded tapped hole 35 extending from the top to the bottom surfaces is positioned approximately at center of the base member 32. A flanged sleeve 36 with a knurled outside surface 37 and threaded outer body engages the top surface of the threaded tapped hole in the base member 32. The flanged sleeve 36 contains a hexagonal shaped hole 38 formed longitudinally therethrough. A hexagonal shaped rod 39 is placed slideably in the matching hexagonal shaped hole 38 in the flanged sleeve. The rod 39 includes a hole extending longitudinally, from the top end to the bottom end. A threaded hole is provided at the top end of the rod 39 for mounting a swivel fitting 49 to connect to a vacuum source 50 communicating with a suction cup 51 mounted to the bottom end of rod 39. Rod 39 also includes a first retaining ring groove 41 and a second retaining groove 42 formed around the hexagonal surfaces near both ends. A first compression spring 45 is inserted between the top surface 33 of the base member 32 and the bottom surface of the flanged sleeve 36. A first retaining C-clip 47 is inserted in the first groove 41 of the hexagonal shaped rod 39. The rod 39 is placed through the flanged end of the hexagonal hole 38 extending through the bottom end of the flanged sleeve 36. A second compression spring 46 is inserted and compressed between the bottom surface of the flanged sleeve 36 and retained in compression by a second C-clip 48 inserted at the bottom end of the rod.

The process of adjustment entails the picking up of a semiconductor device by vacuum at the tip of a sleeve assembly nozzle 11 having a longitudinal axis situated parallel to a Z axis of an orthogonal XYZ coordinate system and being movable in X and Y directions laterally of the Z axis in order to translate the sleeve assembly nozzle 11 between different pick-up sites and a test site, and placing the semiconductor device onto a test contactor for testing. The improvement includes means, operatively associated with the sleeve assembly nozzle 11, for adjusting the tip relative to a top surface of the semiconductor 10.

Figure 6A:
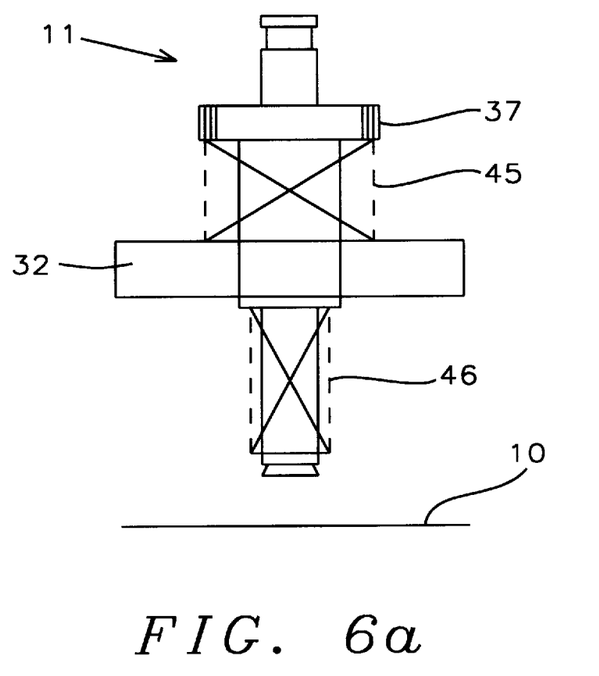
FIGS. 6a, 6b is a schematic view of the assembled body contactor of the invention showing the simplified adjustment procedure
Figure 6B:
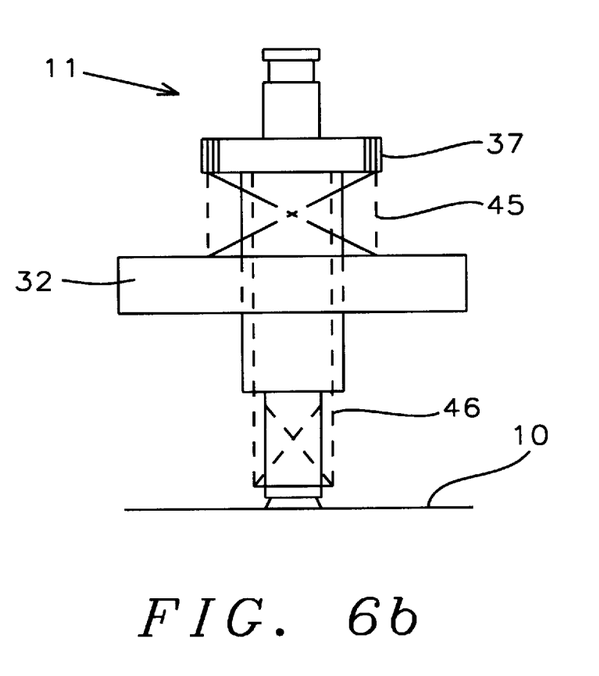

FIG. 6 illustrates the single handed adjustment procedure of the sleeve assembly nozzle 11 by simply turning the knurled flange of flanged sleeve 36. Turning clockwise, the sleeve assembly nozzle is lowered, counter-clockwise raises the nozzle. The uncompressed length of the first compression spring 45 is greater than the body length of flanged sleeve 36, therefore, is under compression when inserted between the top surface 34 of the base member 32 and the bottom surface of the flanged sleeve 36. This holds the sleeve assembly nozzle firmly. The spring tension is selected to add stiffness to the assembly and for ease of adjusting the knurled flange.

The improvement also includes means, operatively associated with the sleeve assembly nozzle, for controlling the semiconductor device contact pressure by the mechanical arrangement of said sleeve assembly nozzle.

The second compression spring 46 placed between the bottom surface of the flanged sleeve and the second retaining C-clip 48 ensures the adjusted setting. In addition to this, it also cushions the contact between the sleeve assembly nozzle and device 10.

The objects of the invention are achieved. The adjustment of the sleeve assembly nozzle 11 relative to the top surface of the chip can be done free of tools, single handed, and accurately. The improvements increases handler utilization and reduces unscheduled down time, also reduces damage to product.

While the invention has been particularly shown and described with reference to the preferred embodiments thereof, it will be understood by those skilled in the art that various changes in form and details may be made without departing from the spirit and scope of the invention.

What is claimed is:

1. A method for adjusting a relative position of a modified pick and place vacuum probe with respect to a top surface of a semiconductor device comprising the steps of:

providing a test handler which includes an aluminum body contactor housing having a base member with a top and bottom surface;

providing a threaded tapped hole extending from the top to the bottom surface of said base member of said aluminum body contactor housing, said threaded tapped hole located approximately at center of said base member;

providing a flanged sleeve having a knurled flange and threaded outer body engaging the top surface of said threaded tapped hole of said base member, said flanged sleeve containing a hexagonal shaped hole formed longitudinally therethrough;

providing a hexagonal shaped rod slideable in said matching hexagonal shaped hole of said flanged sleeve, said rod includes a hole extending longitudinally, from a proximal end to a distal end for communicating a vacuum, said rod further includes retaining ring grooves formed around the hexagonal surfaces near both ends of said rod;

providing a first compression spring means inserted between the top surface of said base member and the bottom surface of said knurled flange of said flanged sleeve;

providing a first c-clip retaining ring inserted in groove of said hexagonal shaped rod, said rod placed in flanged end of said hexagonal hole.

2. The method of claim 1 wherein manually turning the knurled flange of said flanged sleeve clockwise, lowers said tip relative to a planar horizontal reference, alternatively, turning the knurled flange counterclockwise, raises the tip.

3. The method of claim 1 wherein the compression of said first compression spring adds stiffness to said sleeve assembly nozzle.

4. The method of claim 1 wherein said means for controlling the tip contact pressure on a semiconductor device, comprising the steps of:

providing a second compression spring means inserted between the bottom surface of said flanged sleeve and retained in a minimally compressed state by inserting a second c-clip at the distal end of said rod.

5. The method of claim 1 wherein minimally compressed state of said second compression spring provides a controlled contact pressure of said tip during picking and placing of a semiconductor device.

6. The method of claim 1 wherein the controlled contact pressure is established during contact of said tip on a semiconductor device, said minimally compressed spring permitting the sleeve assembly nozzle to displace upwards during mechanical interference.

* * * * *

UNITED STATES PATENT AND TRADEMARK OFFICE
CERTIFICATE OF CORRECTION

PATENT NO.    : 6,184,047 B1
DATED         : February 6, 2001
INVENTOR(S)   : Shekar et al.

It is certified that error appears in the above-identified patent and that said Letters Patent is hereby corrected as shown below:

Column 2,
Line 50, after "a" please insert -- mechanism for adjusting a tip relative to a top surface of a semiconductor device and a mechanism for controlling semiconductor device contract pressure by a mechanical arrangement of device members of the contractor sleeve assembly. --

Signed and Sealed this

Tenth Day of August, 2004

JON W. DUDAS
*Acting Director of the United States Patent and Trademark Office*